US009907152B2

(12) United States Patent
Kaskey et al.

(10) Patent No.: US 9,907,152 B2
(45) Date of Patent: Feb. 27, 2018

(54) ILLUMINATION SYSTEM WITH MONITORING OPTICAL OUTPUT POWER (71) Applicant: Applied Materials, Inc., Santa Clara, CA (US)

(72) Inventors: Jeffrey Kaskey, Livermore, CA (US); Thomas Laidig, Richmond, CA (US); David Markle, Pleasanton, CA (US); Jang Fung Chen, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/087,173

(22) Filed: Mar. 31, 2016

(65) Prior Publication Data
US 2016/0219684 A1    Jul. 28, 2016

Related U.S. Application Data (63) Continuation of application No. 13/629,382, filed on Sep. 27, 2012, now abandoned.
(Continued)

(51) Int. Cl.
H05B 37/04      (2006.01)
H05B 37/03      (2006.01)
G03F 7/20       (2006.01)

(52) U.S. Cl.
CPC .............. *H05B 37/04* (2013.01); *H05B 37/03* (2013.01); *H05B 37/032* (2013.01); *G03F 7/70575* (2013.01)

(58) Field of Classification Search
None
See application file for complete search history.

(56) References Cited

U.S. PATENT DOCUMENTS 4,135,116 A    1/1979  Smith
4,798,962 A    1/1989  Matsumoto et al.
(Continued)

FOREIGN PATENT DOCUMENTS

CN    1886774 A       12/2006
JP    63-198324 A     8/1988
(Continued)

OTHER PUBLICATIONS

Taiwan Office Action dated Jul. 25, 2016, for Taiwan Patent Application No. 101135869.
(Continued)

*Primary Examiner* — Douglas W Owens
*Assistant Examiner* — James H Cho
(74) *Attorney, Agent, or Firm* — Patterson + Sheridan LLP (57) ABSTRACT An illumination system and methods for controlling the illumination system are provided. In one embodiment, the method includes providing a plurality of illumination sources, monitoring optical output power of the plurality of illumination sources over a period of time, and controlling the plurality of illumination sources to maintain a predetermined level of optical output power. The method further includes compensating for degradations of one or more of the plurality of illumination sources to maintain the predetermined level of optical output power, predicting a lifetime of the illumination system based on the parameters of the plurality of illumination sources, and performing periodic maintenance of the plurality of illumination sources according to a quality control schedule.

17 Claims, 7 Drawing Sheets

Related U.S. Application Data (60) Provisional application No. 61/541,484, filed on Sep. 30, 2011.

(56) References Cited

U.S. PATENT DOCUMENTS

| | | | |
|---|---|---|---|
| 5,406,461 | A | 4/1995 | Amann |
| 5,684,566 | A | 11/1997 | Stanton |
| 6,495,973 | B1 | 12/2002 | Allen, Jr. |
| 6,963,175 | B2 | 11/2005 | Archenhold et al. |
| 6,995,519 | B2 | 2/2006 | Arnold et al. |
| 7,375,473 | B2 * | 5/2008 | Cok .................. H05B 33/0896 315/308 |
| 8,253,923 | B1 | 8/2012 | Chen et al. |
| 8,299,722 | B2 * | 10/2012 | Melanson .......... H05B 33/0869 315/291 |
| 8,624,527 | B1 | 1/2014 | Meir et al. |
| 8,669,710 | B2 | 3/2014 | Yu et al. |
| 2002/0140379 | A1 | 10/2002 | Chevalier et al. |
| 2005/0219493 | A1 | 10/2005 | Oshida et al. |
| 2006/0227085 | A1 * | 10/2006 | Boldt, Jr. ................ G09G 3/32 345/83 |
| 2008/0088648 | A1 | 4/2008 | Nathan et al. |

FOREIGN PATENT DOCUMENTS

| | | |
|---|---|---|
| JP | 06-224107 A | 12/1994 |
| JP | 2004-039871 A | 2/2004 |
| JP | 2004-146793 A | 5/2004 |
| JP | 2004327823 A | 11/2004 |
| JP | 2008-241876 A | 10/2008 |
| JP | 2008-241877 A | 10/2008 |
| WO | 2010/036524 A1 | 4/2010 |
| WO | 2010/068536 A1 | 6/2010 |
| WO | 2011/096365 A1 | 8/2011 |

OTHER PUBLICATIONS

PCT Notice of Transmittal of the International Search Report and the Written Opinion of the International Searching Authority for International Application No. PCT/US2012/057941 dated Dec. 6, 2012; 9 total pages.
English translation of Japanese Office Action for Application No. 2014-533399 dated Aug. 4, 2015; 5 total pages.
Korean Office Action (with attached English translation) for Application No. 10-2014-7011068 dated Aug. 17, 2015; 8 total pages.
Singapore Written Opinion for Appplication No. 11201401092Q dated Sep. 10, 2015; 15 total pages.
English translation of Japanese Office Action for Application No. 2014-533399 dated Jan. 5, 2016; 5 total pages.
Chinese Office Action dated Sep. 29, 2016 for Application No. 201280047922.7.
Taiwan Office Action dated Nov. 3, 2016, for Taiwan Patent Application No. 101135869.
Chinese Office Action dated Apr. 7, 2016, for Chinese Patent Application No. 201280047922.7.
Office Action from Japanese Patent Application No. 2014-533399 dated Feb. 28, 2017.
Japanese Office Action (English translation) dated Feb. 17, 2017, for Japanese Patent Application No. 2016-092896.
First Office Action dated Nov. 16, 2017 for Chinese Application No. 201610311626.3.
Office Action dated Oct. 17, 2017 for Japanese Patent Application No. 2016-092896.
Office Action dated Nov. 14, 2017 for Korean Patent Application No. 10-2016-7012973.

* cited by examiner

ILLUMINATION SYSTEM WITH MONITORING OPTICAL OUTPUT POWER

CROSS REFERENCE TO RELATED APPLICATIONS

This application is a continuation of U.S. patent application Ser. No. 13/629,382, filed Sep. 27, 2012, which claims the benefit of U.S. Provisional Patent Application Ser. No. 61/541,484, filed Sep. 30, 2011, which herein are incorporated by reference.

FIELD OF THE INVENTION

The present invention relates to the field of lithography manufacturing. In particular, the present invention relates to system and method for enhanced lifetime illumination with multiple illumination sources.

BACKGROUND OF THE INVENTION

Lithography manufacturing has been the choice of volume production method for making electronic devices, such as semiconductor integrated circuit (IC), printed circuit board (PCB), light emitting diode (LED), laser diode (LD), flat panel display (FPD), quartz oscillators (QO), microelectromechanical (MEMS) parts and other electronic applications such as bump bonding, thin film heads (TFH) and multichip module manufacturing, 3D packaging using through silicon vias (TSV), and the related modem electronics and/or optical devices.

One of the lithography process challenges for volume manufacturing is to ensure a stable and consistent patterning performance within specifications from substrate to substrate, lot to lot, and day to day. The goal is to preserve a well-established process window to ensure profitable manufacturing yield while minimizing unwanted equipment downtime for the lithography tools used in manufacturing.

Conventionally, lithography technologies for manufacturing of modem electronic and optical devices are derived from lithography process technologies for making semiconductor ICs. Majority of lithography exposure tools used for patterning various types of substrates are contact or proximity aligners, projection stepper or scanner systems. Regardless of the tool types, depending on the process window control specifications, as general rule of thumb, it is desirable to keep the illumination intensity uniformity at about 1~2% or less within the exposure field.

The reason for such a stringent illumination control requirement is mainly due to the image formation nature of photo resist that is highly dependent on the overall exposure energy that was received. For an actinic exposure wavelength, the exposure energy (mili-Joules or mJs) is the product of optical intensity (mili-watts/sq-cm) and time (seconds). To control the uniformity of the line width for the printed feature to be within specifications, the first consideration is to ensure illumination intensity to be consistent and stable. With a higher intensity level, for nominal exposure energy, the exposure time can be shorter, and the exposure throughput can be better. Should the illumination intensity become lower, to get the same nominal exposure energy, it can be compensated by increasing the exposure time. Hence for a typical lithography manufacturing with nominal exposure energy, it is desirable to monitor the optical intensity level.

Traditionally lithography exposure tool has been designed with a single illumination source, such as using a mercury short-arc lamp or an excimer laser. There is a limited life time for mercury arc lamp to be several hundred hours. For excimer laser, the gas used for laser emission must be re-filled in a year or less of operation. Since the life time and failure mode of both source types have been well-characterized, it has been relatively straightforward to monitor optical intensity with a single illumination source.

Without a viable alternative in the past, the industry has accustomed to limited life time and excessive electrical energy used in mercury arc lamp. In order to improve the exposure throughput, more optical intensity must be generated. Typically for mercury arc lamp specified with 1K Watts input electrical power, to generate the desired actinic exposure wavelength, say, 365 nm, by passing through an in-line optical filter. Depending on the optical system used, it can typically deliver 100~200 m Watts or thereabout optical intensity at the photo resist surface. For 100 mJs nominal exposure energy, it may use 0.5 to 1 seconds of exposure time.

As the lamp becomes aged, the actinic optical power is decreased, more exposure time is used. Eventually for several hundreds of hours in operation, the lamp output becomes too low or simply failed for no output. Such a lithography manufacturing using mercury arc lamp, the typical practice of performing illumination monitoring process is to check optical intensity level daily. For each process lot, a test exposure is performed. After resist develop, the feature line width is measured against a specification range. Then it is either to tune the exposure time or change to the exposure energy setting to print the target line width.

The replacement of high pressured mercury arc lamp source is not just a quick lamp change process. The lamp must be tuned off and let it cool down for handling. After a new lamp is installed, the arc source must be focused and adjusted to optimize for the best intensity and uniformity. The task normally takes hours to accomplish before allowing the tool to resume manufacturing. Every two to four weeks in operation, the same task must be repeated for lamp replacement. Unlike mercury arc lamp where the main optical output bands are from near UV to visible, for excimer laser, however, the optical output wavelength is in deep UV regions such as either 248 nm or 193 nm. The excimer illumination system cost is in the million US dollar range. The illumination maintenance is much more elaborated and could take days. Typically it is required to perform excimer gas re-filling and tuning either semiannually or annually.

Therefore, there is a need to address the above issues of the conventional illumination systems.

SUMMARY

The present disclosure describes methods to address the desire of an illumination system comprising illumination sources with properties such that output intensity can be controlled and lifetime of the illumination system can be predicted, such as with LEDs, diode lasers or solid state lasers. The disclosure includes methods which: control and monitor a multi-emitter illumination system to achieve maximum lifetime, develop and refine a predicted lifetime for an illumination system, compensate for random unplanned failure of one or more illumination sources, and may warn when such compensation is not feasible, monitor an illumination system during operation of an imaging system while sacrificing little or no active operation time from the imaging system. In another embodiment, it describes a use of multi-emitter based illumination sources that can be formed in an intended illumination shape, mixed with multiple wavelength emitter sources whether for alignment or for multi-wavelength exposure applications.

An illumination system and methods for controlling the illumination system are provided. In one embodiment, the method includes providing a plurality of illumination sources, monitoring optical output power of the plurality of illumination sources over a period of time, and controlling the plurality of illumination sources to maintain a predetermined level of optical output power. The method further includes compensating for degradations of one or more of the plurality of illumination sources to maintain the predetermined level of optical output power, predicting a lifetime of the illumination system based on the parameters of the plurality of illumination sources, and performing periodic maintenance of the plurality of illumination sources according to a quality control schedule.

In another embodiment, an illumination system comprises at least one processor and a controller configured to work with the at least one processor. The controller includes logic configured to provide a plurality of illumination sources, logic configured to monitor optical output power of the plurality of illumination sources over a period of time, and logic configured to control the plurality of illumination sources to maintain a predetermined level of optical output power.

In yet another embodiment, a computer program product comprises a non-transitory medium storing computer programs for execution by one or more computer systems. The computer program product further comprise code configured to provide a plurality of illumination sources, code configured to monitor optical output power of the plurality of illumination sources over a period of time, and code configured to control the plurality of illumination sources to maintain a predetermined level of optical output power.

BRIEF DESCRIPTION OF THE DRAWINGS

The aforementioned features and advantages of the invention, as well as additional features and advantages thereof, will be more clearly understandable after reading detailed descriptions of some aspects of the invention in conjunction with the following drawings.

FIGS. 6a-6b illustrate exemplary methods to couple laser diode to fiber according to some aspects of the present disclosure.

FIGS. 7a-7g illustrate exemplary methods of forming fiber bundle modules according to some aspects of the present disclosure.

DESCRIPTION OF SOME ASPECTS

The following descriptions are presented to enable any person skilled in the art to make and use the invention. Descriptions of specific some aspects and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

According to some aspects of the present disclosure, the conventional mercury arc lamp can be replaced by solid state photon emitting sources, such as LED and laser diodes, for cost efficient illumination in lithography manufacturing. The form factor of those solid state photon sources is quite different from the conventional mercury arc lamp. Take Gallium Nitride (GaN) laser diode for example, this photon emitting device is very small, and has dimensions of a few millimeters. From the latest development progress, the electrical power for single laser GaN diode can produce power of nearly 1 Watt. Compare to a kilo-Watts mercury arc lamp capable of producing kilo-Watts, this may seem to be very small.

Conventional mercury arc lamp emission consists of multiple wavelength bands that must be filtered out for single wavelength exposure. On the other hand, GaN laser diode emits monochromatic exposure wavelength efficiently. When the diode laser source is coupled with an optical fiber, with careful design, it produces only a small portion of photon loss in light propagation. If to combine a bundle of optical fibers with each from the corresponding GaN emitter, to emulate a single emitter source of 10 to 12 Watts of input power, it can generate more than sufficient optical illumination intensity for the intended exposure energy comparable to 4 to 5 kilo-Watts of mercury arc lamp.

Solid state photon emitter is known to have extended lifetime, in the range of more than ten thousands hours of operating lifetime. This can be attractive for manufacturers since it represents substantial reduction of equipment down time together with huge electrical power savings over time. For such a multi-emitter illumination source, the challenge is how to best maintain stable and consistent optical intensity level over the extended life time.

For some lithography applications, especially when it comes to exposing thick photo resist film, for example more than 3 microns of film thickness, it is desirable to use multiple exposure wavelengths for higher overall intensity level. Additionally it can minimize standing wave and achieve more depth of focus (DOF) for thicker resist film. In this case, applying a wide bandwidth optical filter may be used for mercury arc lamp as the illumination source. However, the peak intensity ratio from one actinic wavelength to another is dictated by the nature of mercury arc emission. If to use multi-emitter illumination light source, the illumination system can be configured to optimize the peak intensity ratio from one exposure wavelength to the other, when combining the fiber bundle that includes diode lasers and/or LEDs emitting different wavelengths. In addition, the illumination system can be configured to include alignment wavelength using LEDs illumination source. With state slide emitters, the choice on how to apply mixed-ratio wavelengths exposure can be selectively tuned during the exposure.

In a system such as for photolithography where an illuminator system may be based on multiple illumination sources such as LEDs or lasers, it is desirable to keep the total illumination intensity stable and accurate over time. It is desirable to control various factors due to changes in manufacturing environment overtime, including but not limited to: 1) illumination sources change light output over time, 2) susceptible to damage when operated above optical and electrical power thresholds, 3) have variable minimum drive levels, and 4) output power does not hold a constant relationship to input current or power and even within specified operating parameters, that lead to such illumination sources eventually experience wornout, resulting in a limited lifetime. In addition, manufacturing operations can benefit from longer and predictable maintenance cycles, so a system that can be configured to optimize and maximize illuminator lifetime is beneficial.

Figure 1:
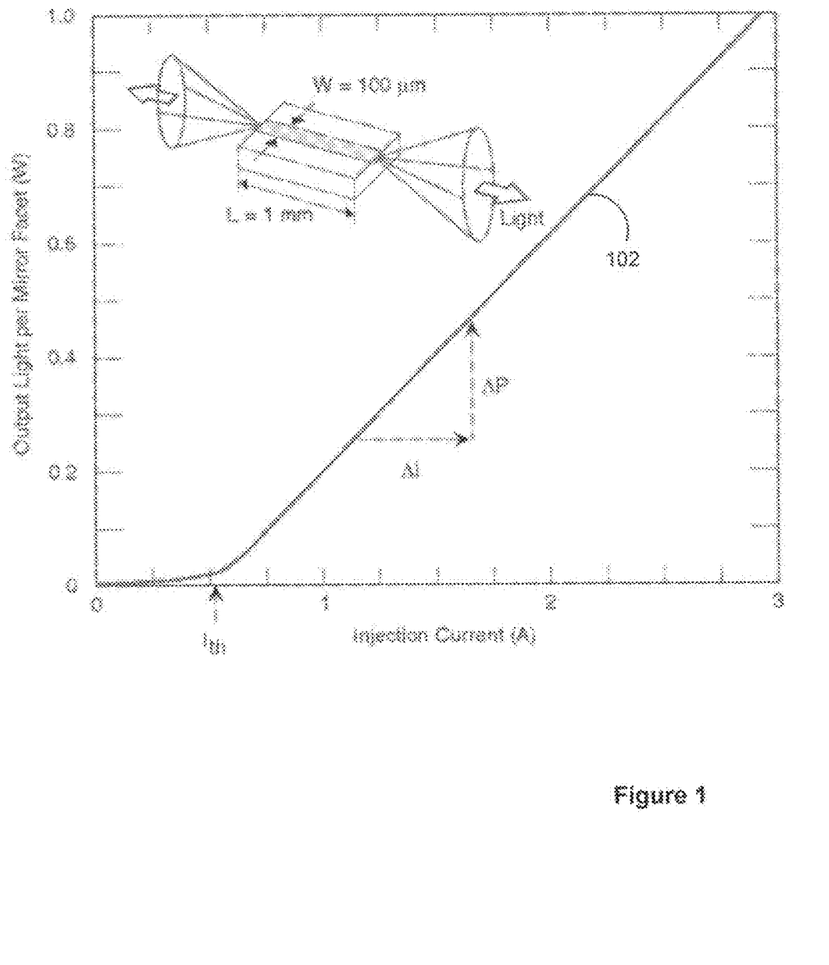
FIG. 1 illustrates an exemplary graph of an output optical power versus injection current of an illumination source according to some aspects of the present disclosure.

FIG. 1 illustrates an exemplary graph of an output optical power versus injection current of an illumination source according to some aspects of the present disclosure. This graph is also called the P/I Curve 102. The vertical axis represents output light per mirror facet (W), and the horizontal axis represents injection current (A). The output optical power varies as a function of the current passing through the diode. When biased below a threshold current $I_{th}$, the output power may be low. But as the current increases over the threshold $I_{th}$, the output optical power increases at rate of dP/dI. The P/I curve slope above threshold current is called a laser diode's slope efficiency and is defined as dP/di. Here dP is the change in the light power output, and dI is the change in the forward current through the diode. Slope efficiency has a unit of mW/mA. Threshold currents lie typically in the range of 25 to 250 mA and the output powers are typically in the range of 1 to 10 mW.

Figure 2:
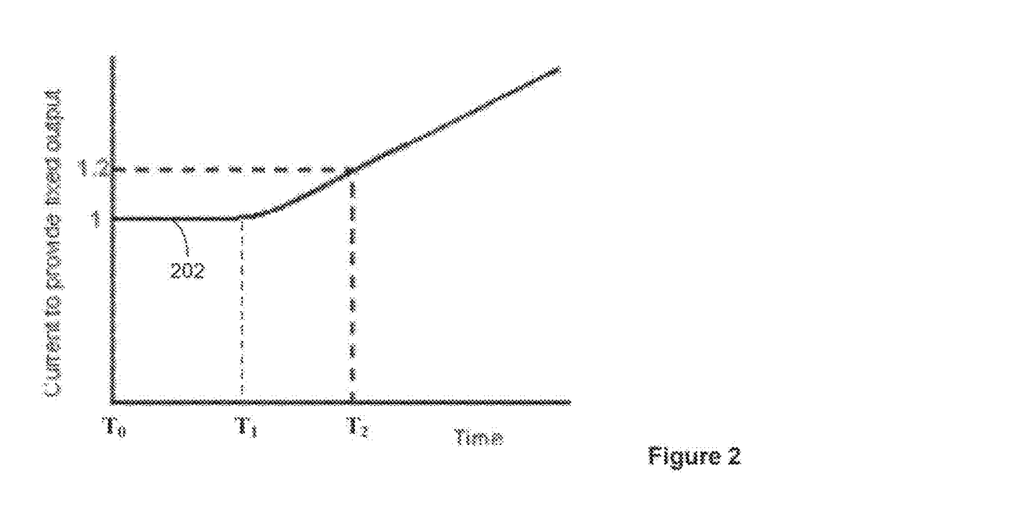
FIG. 2 illustrates an exemplary representation of current employed to provide fixed optical output power over time according to some aspects of the present disclosure.

Some emitters such as GaN laser diodes, and some forms of solid state lasers, tend to fail not catastrophically but instead through an aging and deterioration process. During the aging and deterioration process, more current may be desirable for a given power output. FIG. 2 illustrates an exemplary representation of current employed to provide fixed optical output power over time according to some aspects of the present disclosure. The vertical axis represents current to provide fixed output, and the horizontal axis represents time. As shown in FIG. 2, the current to power ratio 202 remains substantially the same from time $T_0$ to time $T_1$. But over time (after $T_1$), it may be desirable for the system to increase the current level in order to provide same optical output power. For example at time $T_2$, the forward current level requires 1.2 times of the initial current value. In some applications, the higher forward current level may be declared to have reached the end of laser diode life at $T_2$. In some other applications, alternative end-of-life current level may be defined according to the limit of automatic power control circuitry in the equipment.

Laser diodes may suffer from catastrophic optical damage (COD) due to surge current. When increasing current level to boost optical output power, a short may occur at the laser diode edge. When this happens, the output power may suddenly fall and cause an irreversible damage. It is desirable to prevent instantaneous or short current spikes that may damage the laser diodes of the illumination system. Often, the surge may not completely destroy the laser diodes but may lead to a shortened operating life of the laser diodes. In order to improve lifetime of the illumination system or the laser diodes, it is desirable to operate the laser diodes at reduced current levels.

Figure 3:
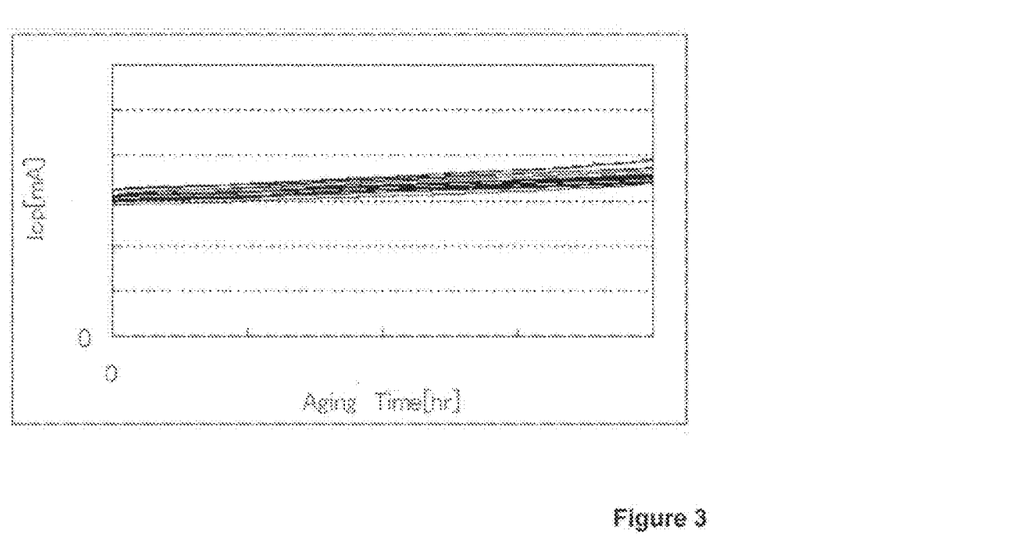
FIG. 3 illustrates an exemplary scenario of aging process of emitters according to some aspects of the present disclosure.

FIG. 3 illustrates an exemplary scenario of aging process of emitters according to some aspects of the present disclosure. The vertical axis represents output current Iop (mA), and the horizontal axis represents aging time (Hours). According to aspects of the present disclosure, the illumination system may be configured to closely monitor the rate of aging mechanisms and characteristics, and configured to actively control modification parameters. As a result, the illumination system may be able to refine the lifetime predictions of a given emitter under existing conditions as well as to help predict the lifetime under modified operation through extrapolation to known models. In one approach, one parameter available for modification is current. In another approach, other variables, such as number of emitters, may be available for modification. In some implementations, characteristics such as temperature, illumination intensity, voltage drop and drive current may be monitored.

Figure 4:
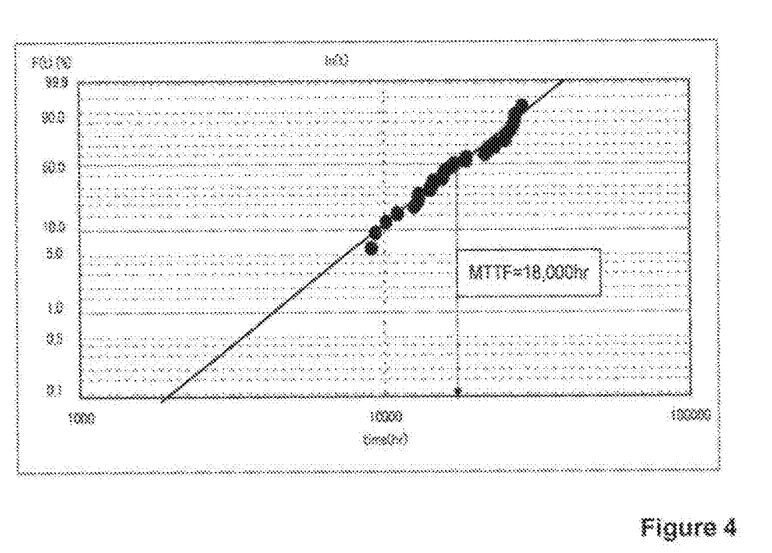
FIG. 4 illustrates a plot of probability of wearout over lifetime of an emitter according to some aspects of the present disclosure.

According to some aspects of the present disclosure, individual device lifetime may be determined as an extent of wearout at least based on one of the following conditions, including but not limited to: 1) the point at which maintaining a stable output power requires a fixed percentage increase in drive current (or power); 2) the point at which intensity has dropped a fixed percentage at a stable drive current (or power). FIG. 4 illustrates a plot of probability of wearout over lifetime of an emitter according to some aspects of the present disclosure. The vertical axis represents probability in terms of a percentage, and the horizontal axis represents time in terms of number of hours of usage.

Since these changes can occur over hours rather than minutes, individual emitter characteristics can be measured between imaging operations. The time between imaging operations that is available for monitor and control may be short relative to the time used to complete a monitor/control operation for all emitters. According to some aspects of the present disclosure, these measurements may be distributed over multiple inter-imaging periods.

One approach is to set illumination levels and equalizing wearout point for all emitters. The individual lifetime of each emitter under existing conditions may be predicted based initially on models using characterization or other preprogrammed data and later by adding measurements made in the course of operation. The controller calculates new operating parameters for all emitters, based on each emitter's output power versus current.

Figure 5:
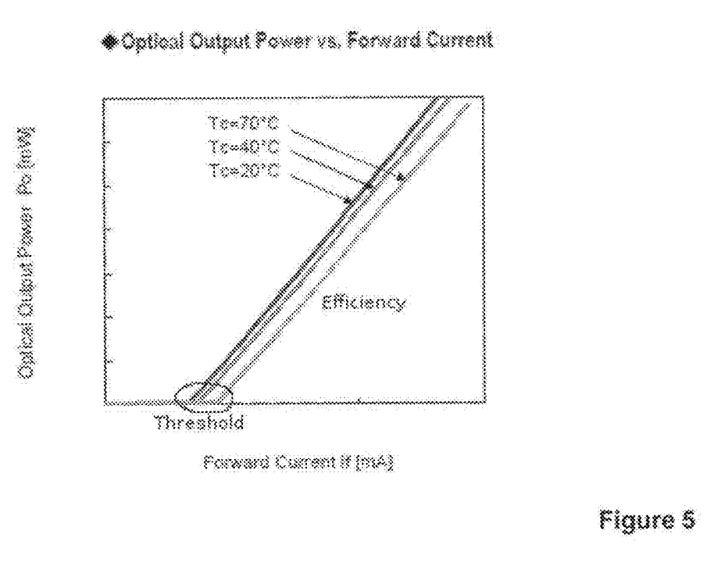
FIG. 5 illustrates a plot of optical output power versus forward current according to some aspects of the present disclosure.

FIG. 5 illustrates a plot of optical output power versus forward current according to some aspects of the present disclosure. As shown in FIG. 5, the vertical axis represents optical output power Po (mW), and the horizontal axis represents forward current If (mA). The plot includes examples of threshold and efficiency that result in an equal predicted lifetime for all emitters at the target system illumination power. It indicates that under different operation temperatures, the threshold and desirable forward current may be shifted. To provide improved assurance of system reliability, the controller may make a similar calculation of new operating parameters assuming failure of one or more emitters. If these new parameters would violate wearout or max spec limits, a warning may be issued indicating the loss of redundancy.

According to some aspects of the present disclosure, the illumination system includes multiple illumination sources (such as emitters). Each emitter may have a separate remotely controlled intensity. Individual emitter intensity may be sampled and logged, for example through a beam splitter by an illumination sensor. In some approaches, logged data can be used to fit current versus optical power model and predictive aging model. Predictive aging model can be used to equalize predicted emitter lifetime by calculating new operating parameters. Operating parameters can be proactively applied to keep illumination constant, even without frequent measurements. In some other approaches, same model can be used to account for redundancy and predict lifetime of the system while compensating for the loss of one or more emitters. A controller can be configured to monitor the optical power limits, electrical power limits, and range of each emitter. The controller can also be configured to readjust (or re-level) expected lifetime of the illumination system relative to illumination power of the emitters.

According to some aspects of the present disclosure, at the end of an imaging process, with a shutter activated if a substrate is in the optical path, new emitter currents can be calculated and applied based on the existing model parameters for aging. In this approach, illumination may be kept substantially constant without sampling each emitter every time. As time allows, individual discrete emitters may then be powered, others emitters may set to off, and the output level can be measured and recorded. If the level does not fit the current model parameters and the difference is determined to be significant by the controller, a new level may be calculated by the controller to determine new control settings for the illumination sources in the system.

In some implementations, taking advantage of the handling time between exposures, the measure, record, and calculate cycles may be repeated as often as desirable before the next imaging process starts. The process is cycled through each of the individual emitter or each set of emitters. At the end of the next imaging process the measure/record/calculate process may start again with the next emitter, or next set of emitters.

Note that the illumination system can be configured to control and manage the illumination sources according to the following conditions, including but not limited to: 1) new currents may not be predictively applied, but may be applied after measurement shows sufficient discrepancy between measured and desired levels; 2) illumination may be a single emitter but the predictive aging model can be used to proactively set illumination drive levels without requiring a measurement for each adjustment; and 3) redundancy may be evaluated according to expected lifetime based on failure of one or more emitters.

Figure 6A:
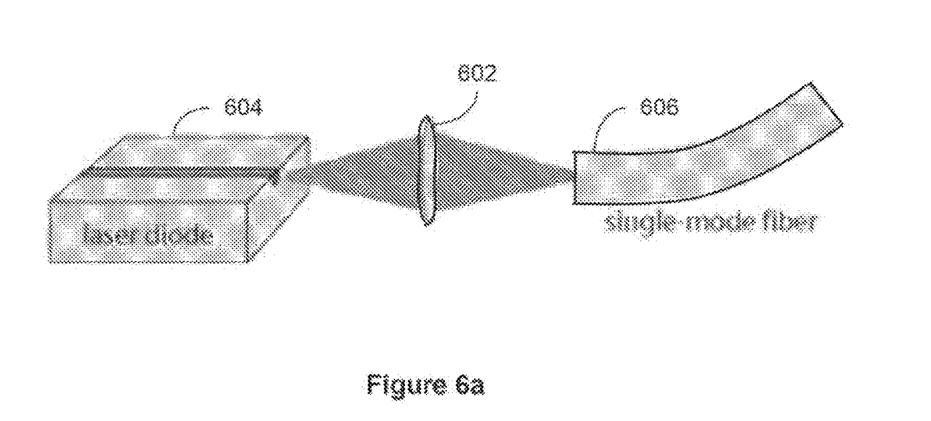
FIG. 6a shows a spherical lens or a lens doublet can be used to image the laser diode facet to the fiber core.
Figure 6B:
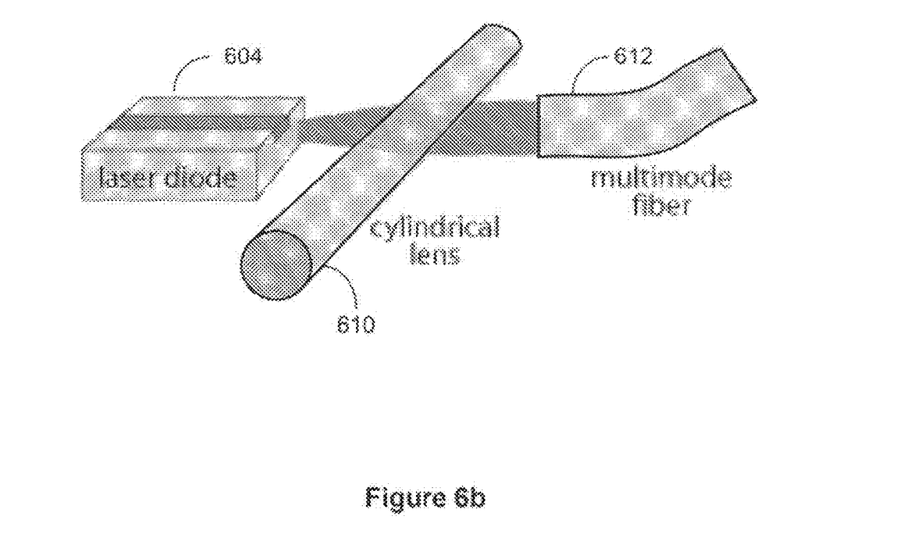
FIG. 6b shows another form of coupling by using fiber lens to collimate the beam from the laser diode facet to the multimode fiber in the fast axis direction.

FIGS. 6a-6b illustrate exemplary methods to couple laser diode to fiber according to some aspects of the present disclosure. As shown in FIG. 6a, a spherical lens or a lens doublet 602 can be used to image the laser diode facet 604 to the fiber core 606. FIG. 6b shows another form of coupling by using fiber lens 610 to collimate the beam from the laser diode facet 604 to the multimode fiber 612 in the fast axis direction.

FIG. 7a-7g illustrate exemplary methods of forming fiber bundle modules according to some aspects of the present disclosure. Note that for simplicity of illustration, only the fiber core has been shown but not fiber cladding, or the outer layer enclosing the fiber core, is not shown in FIGS. 7a-7g. Each circle may also represent an illumination source in some examples of the present disclosure. Also note that this type of fiber bundle is different from the types of traditional fiber combiners that have been accustomed to the optical communication industry in general. For those of traditional types of fiber combiners, multiple input fibers are either "fused" into one fiber or "touch-joined in the core" to have one fiber as the output.

Figure 7A:
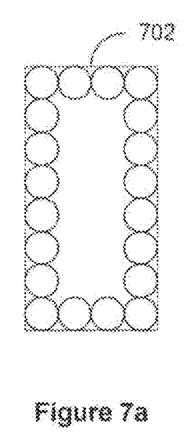
FIG. 7a illustrates an exemplary fiber bundle module that is not fully populated with emitters.
Figure 7B:
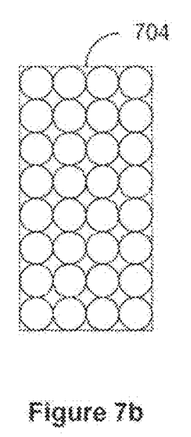
FIG. 7b illustrates another exemplary fiber bundle module which is fully populated.
Figure 7C:
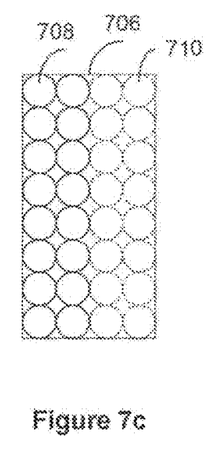
FIG. 7c illustrates yet another exemplary fiber bundle module that includes a first set of illumination sources in an active state and a second set of illumination sources in an inactive state.
Figure 7D:
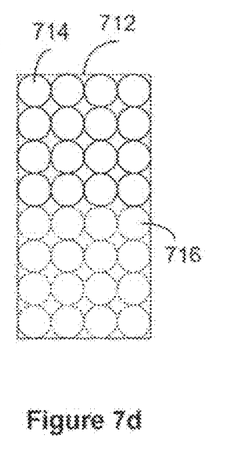
FIG. 7d illustrates yet another exemplary fiber bundle module that includes a first set of illumination sources in an active state and a second set of illumination sources in an inactive state.

In this example, FIG. 7a illustrates an exemplary fiber bundle module 702 that has same type of emitters (shown as circles); and the fiber bundle module is not fully populated with emitters (or light pipes) as the center is empty in this example. FIG. 7b illustrates another exemplary fiber bundle module 704 which in this case is fully populated. Note that the fiber bundle modules 702 and 704 may be used interchangeably according to requirements of specific applications. In other words, fiber bundle module 704 may be used to swap out fiber bundle module 702 in an illumination system, or vice versa. FIG. 7c illustrates yet another exemplary fiber bundle module 706 that includes a first set of illumination sources 708 in an active state (shown as circles) and a second set of illumination sources 710 in an inactive state (shown as dotted circles). FIG. 7d illustrates yet another exemplary fiber bundle module 712 that includes a first set of illumination sources 714 in an active state (shown as circles) and a second set of illumination sources 716 in an inactive state (shown as dotted circles).

Figure 7E:
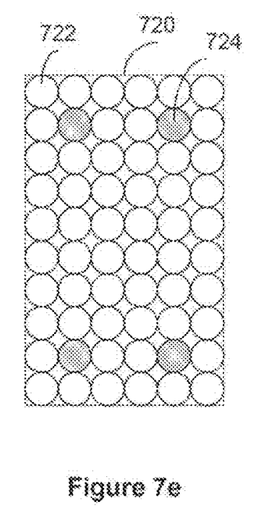
FIG. 7e illustrates yet another exemplary fiber bundle module that includes actinic illumination sources and non-actinic illumination sources.
Figure 7F:
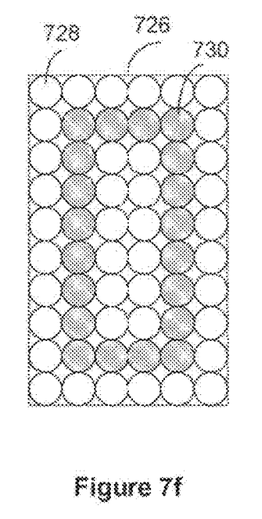
FIG. 7f illustrates yet another exemplary fiber bundle module that includes a first set of illumination sources having a first exposure wavelength and a second set of illumination sources having a second exposure wavelength.
Figure 7G:
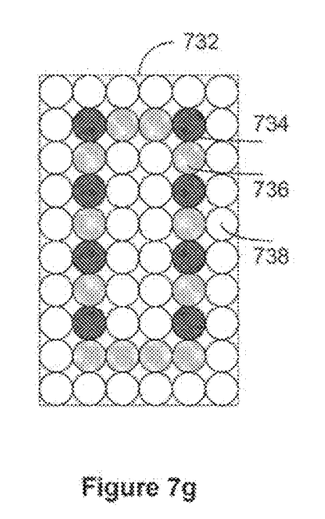
FIG. 7g illustrates yet another exemplary fiber bundle module that includes multiple types of illumination sources.

FIG. 7e illustrates yet another exemplary fiber bundle module 720 that includes actinic illumination sources 722 (shown as while circles) and non-actinic illumination sources 724 (shown as grey circles). Note that the fiber bundle module 720 includes a 6×10 array of illumination sources, while the fiber bundles shown in FIGS. 7a-7d include a 4×8 array of illumination sources. According to some aspects of the present disclosure, different configurations of fiber bundle modules and connector modules may be designed to accommodate the physical space and optical output requirements of specific applications. FIG. 7f illustrates yet another exemplary fiber bundle module 726 that includes a first set of illumination sources 728 having a first exposure wavelength (shown as while circles) and a second set of illumination sources 730 having a second exposure wavelength (shown as grey circles). FIG. 7g illustrates yet another exemplary fiber bundle module 732 that includes multiple types of illumination sources. For example, the fiber bundle module 732 may include a first set of illumination sources 734 having a first exposure wavelength (shown as black circles), a second set of illumination sources 736 having a second exposure wavelength (shown as grey circles), and a third set of illumination sources 738 having a third exposure wavelength (shown as white circles).

Also in FIGS. 7a-7g, multiple fibers bundled into a desired output shape are shown for improved illumination power and performance. The cladding layers cause no light output between fiber cores hence form "dark ring" surrounding every fiber core. This may diminish overall optical power intensity of the fiber bundle. But it can be greatly minimized by using optical fiber material that comes with very thin layer of cladding layer relative to the diameter of the fiber core.

According to some aspects of the present disclosure, the illumination system can be configured to control and monitor of a solid state multiple emitter light source for lithography illumination. In addition, multiple emitter illuminations may be configured to enable digital-step tuning control of illumination in terms of multiple actinic wavelength ratios. The shape of fiber bundle can be configured to enhance lithography imaging performance. This can be implemented with solid state illumination sources since each emitter can be electronically turned on/off.

The illumination system can be implemented with multiple illumination sources, such as solid state devices like LED's, diode lasers, or other light emitting devices, that may be used in a controllable fashion for producing a substantially constant illumination power output.

For our invention to achieve efficiency is to choose illumination sources that do not to follow the Lambert's cosine law closely. According to this law, the illumination at any point on a surface is proportional to the cosine of the angle between the normal at that point and the direction of luminous flux. LED and mercury arc lamp are examples of such type of illumination sources. In other words, the "cosine" illuminators are not directional in nature. When applied with a designated reflector for example having an elliptical shape, the illumination system can be configured to direct the light beam in a parallel fashion. Due to the nature of "cosine" illumination, it would be rather inefficient to collect light for illumination purposed when the entrance pupil of illumination optics may be relative compact in certain applications. In this case, small amount of light may be able to get collected hence wasting a lot of illumination energy. For a diode laser source, on the contrary, it emits directional beam with a relatively small spread cone angle in nature normally is not being recognized as one of the "cosine" illumination types. The illumination system can be configured to focus the laser output into a spot size close to the emitting wavelength to feed into the entrance of optical fiber. This allows minimal light loss propagating through an optical fiber.

One challenge of using diode laser source is the presence of laser speckles, which may be seen as eye disturbing random light and dark spots on the illuminated plane. The laser speckles may cause the printed pattern to appear visually non-uniform and inconsistent in the imaged feature edges, which can be observed under optical microscope with adequate magnification. This is an unavoidable outcome of constructive and destructive effect of monochromatic coherence illumination. To choose diode laser for illumination, a mechanism may be devised to minimize speckles. This may be performed by placing a diffuser in front of the laser source. Essentially this is an attempt to emulate a "cosine" illumination source and that could cause more light loss. Not desirable for our application. To address the above issue, the disclosed illumination system mixes collected from a bundle of optical fibers with its own diode laser source, which can minimize laser speckles to an extent. Next, the system uses a pixel blending imaging method that uses hundreds of exposure flashes to collectively form one image pattern on photo resist.

Figure 8:
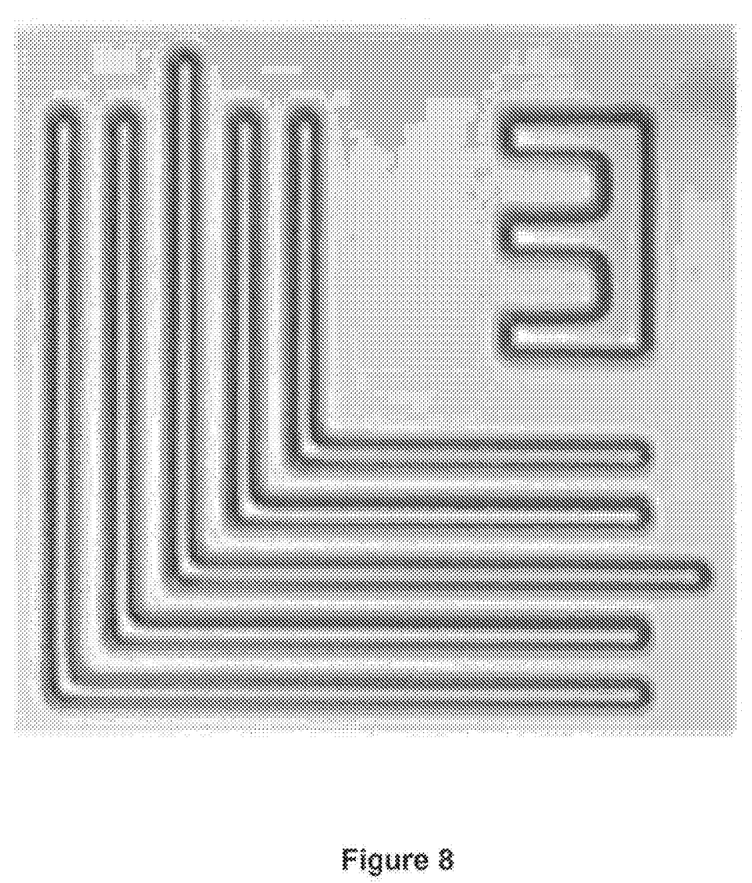
FIG. 8 illustrates an image output of exemplary methods of blending multiple exposures according to some aspects of the present disclosure.

According to some aspects of the present disclosure, one implementation of the pixel blending imaging method is to move the substrate relative to the DMD from a fixed position. As the substrate moves, a series of short exposure flashes are applied. The duration of each exposure flash can be sufficiently short to prevent from image smudging. As substrate moves to the next location, depending on where it is relative to the DMD, a different set of micro mirror pixels can be turn on for making the exposure flash. In some implementations, hundreds of exposure flashes may be used to achieve nominal exposure desirable for the photo resist. Thus the nominal exposure can be the sum from many flashes of different micro mirrors. FIG. 8 illustrates an image output of exemplary methods of blending multiple exposures according to some aspects of the present disclosure. This exemplary image is produced by using a pixel blending exposure method described above. As shown, the image feature edges are smooth and uniform. No laser speckles effect could be observed.

The multiple solid state light emitting sources may each be connected to an optical fiber. A collection of optical fiber bundles corresponding to their solid state light emitters are configured to form a single uniform illumination source for lithography exposure application. Although each of the optical fiber is mixed in a bundle of optical fibers, the system can be configured to identity each fiber light output to correspond to the origin of emitter source, hence controlling each individual emitter light source.

Each emitter light source can be checked periodically, which can be programmed in between exposure flashes, wafer lot changes, substrate loading and unloading, specific time when machine is not in operation, or any duration that is suited for light intensity and/or life time quality check. The checking for lifetime and/or intensity level can be done for the entire emitters at one time or can be done individually in taking turns, as long as each emitter is being evenly tested over specific time duration.

One method of digitally tuning the intensity level step for the multiple emitter lithography illumination is to selectively not flashing some of emitters to reduce the overall intensity level. The selection of not to flash certain emitters during the step-down level exposure can be either determined automatically by a software program or by human operator as long as the illumination uniformity is controlled under specification.

For a lithography illumination system using multiple emitter light sources, the system can be configured to selectively turn on certain emitters with different exposure wavelengths. Using multiple exposure wavelengths, the illumination system can be configured to minimize standing wave effect in the photo resist film due to monochromatic exposure wavelength. The standing wave is one of the contributors for causing feature CD variation. For a lithography illumination system using multiple emitter light source, the nominal exposures may be formed by a number of exposure flashes each with different actinic wavelengths to achieve the overall lithography imaging purpose. Multiple non-actinic emitters for alignment purpose may also be included in the fiber bundle and they may also be subjected to the same tuning application for quality control purposes.

Figure 9:
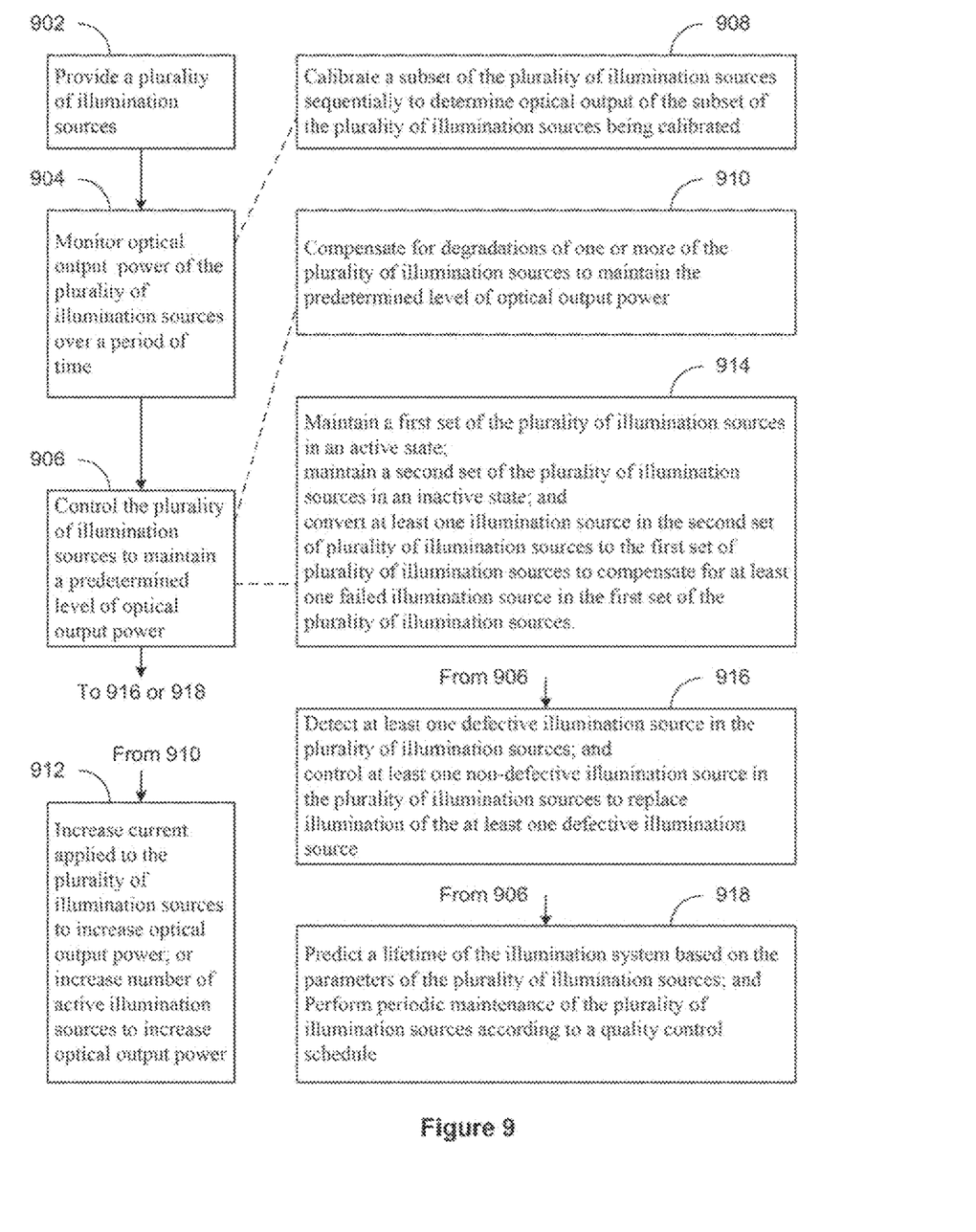
FIG. 9 illustrates a method of controlling an illumination system according to some aspects of the present disclosure.

FIG. 9 illustrates a method of controlling an illumination system according to some aspects of the present disclosure. In the exemplary embodiment shown in FIG. 9, a controller can include logic configured to provide a plurality of illumination sources in block 902. In block 904, the controller can include logic configured to monitor optical output power of the plurality of illumination sources over a period of time. In block 906, the controller can include logic configured to control the plurality of illumination sources to maintain a predetermined level of optical output power. The plurality of illumination sources comprises at least one of: actinic illumination sources and non-actinic illumination sources, and a first set of illumination sources having a first exposure wavelength and a second set of illumination sources having a second exposure wavelength.

According to embodiments of the present disclosure, the logic performed in block 904 may further include logic performed in block 908. For example, block 908 may include logic configured to calibrate a subset of the plurality of illumination sources sequentially to determine optical output of the subset of the plurality of illumination sources being calibrated.

The logic performed in block 906 may further include logic performed in blocks 910 and 914. Block 910 may include logic configured to compensate for degradations of one or more of the plurality of illumination sources to maintain the predetermined level of optical output power. The logic configured to compensate for degradations of one or more of the plurality of illumination sources comprises at least one of logic configured to increase current applied to the plurality of illumination sources to increase optical output power, and logic configured to increase number of active illumination sources to increase optical output power as shown in block 912.

Block 914 includes logic configured to maintain a first set of the plurality of illumination sources in an active state, logic configured to maintain a second set of the plurality of illumination sources in an inactive state, and logic configured to convert at least one illumination source in the second set of plurality of illumination sources to the first set of plurality of illumination sources to compensate for at least one failed illumination source in the first set of the plurality of illumination sources.

Block 916 includes logic configured to detect at least one defective illumination source in the plurality of illumination sources, and logic configured to control at least one non-defective illumination source in the plurality of illumination sources to replace illumination of the at least one defective illumination source. Block 918 includes logic configured to predict a lifetime of the illumination system based on the parameters of the plurality of illumination sources, and logic configured to perform periodic maintenance of the plurality of illumination sources according to a quality control schedule.

It will be appreciated that the above description for clarity has described some aspects of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The method and system of the present disclosure can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed some aspects may be used, while still employing the same basic underlying mechanisms and methodologies. The foregoing description, for purposes of explanation, has been written with references to specific some aspects. However, the illustrative discussions above are not intended to be exhaustive or to limit the invention to the precise forms disclosed. Many modifications and variations are possible in view of the above teachings. The some aspects were chosen and described to explain the principles of the invention and their practical applications, and to enable others skilled in the art to best utilize the invention and various some aspects with various modifications as suited to the particular use contemplated.

The invention claimed is:

1. A method for controlling an illumination system, comprising:
monitoring optical output power of a plurality of illumination sources over a period of time, comprising:
calibrating a subset of the plurality of illumination sources sequentially to determine optical output of the subset of the plurality of illumination sources being calibrated; and
controlling the plurality of illumination sources to maintain a predetermined level of optical output power, wherein the controlling the plurality of illumination sources comprises:
maintaining a first set of the plurality of illumination sources in an active state;
maintaining a second set of the plurality of illumination sources in an inactive state; and
converting at least one illumination source in the second set of plurality of illumination sources to the first set of plurality of illumination sources to compensate for at least one failed illumination source in the first set of the plurality of illumination sources.

2. A method for controlling an illumination system, comprising:
monitoring optical output power of a plurality of illumination sources over a period of time, comprising:
calibrating a subset of the plurality of illumination sources sequentially to determine optical output of the subset of the plurality of illumination sources being calibrated;
controlling the plurality of illumination sources to maintain a predetermined level of optical output power;
detecting at least one defective illumination source in the plurality of illumination sources; and
controlling at least one non-defective illumination source in the plurality of illumination sources to replace illumination of the at least one defective illumination source.

3. The method of claim 2, wherein the plurality of illumination sources comprises at least one of:
actinic illumination sources and non-actinic illumination sources; and a first set of illumination sources having a first exposure wavelength and a second set of illumination sources having a second exposure wavelength.

4. The method of claim 2, wherein controlling the plurality of illumination sources comprises:
compensating for degradations of one or more of the plurality of illumination sources to maintain the predetermined level of optical output power.

5. The method of claim 4, wherein compensating for degradations of one or more of the plurality of illumination sources comprises at least one of:
increasing current applied to the plurality of illumination sources to increase optical output power; and
increasing number of active illumination sources to increase optical output power.

6. The method of claim 2, further comprising at least one of:
predicting a lifetime of the illumination system based on parameters of the plurality of illumination sources; and
performing periodic maintenance of the plurality of illumination sources according to a quality control schedule.

7. An illumination system, comprising:
at least one processor;
a controller configured to work with the at least one processor, wherein the controller includes:
a first logic configured to monitor optical output power of a plurality of illumination sources over a period of time, wherein the first logic comprises a second logic configured to calibrating a subset of the plurality of illumination sources sequentially to determine optical output of the subset of the plurality of illumination sources being calibrated; and
a third logic configured to control the plurality of illumination sources to maintain a predetermined level of optical output power, wherein the third logic configured to control the plurality of illumination sources comprises:
a fourth logic configured to maintain a first set of the plurality of illumination sources in an active state;
a fifth logic configured to maintain a second set of the plurality of illumination sources in an inactive state; and
a sixth logic configured to convert at least one illumination source in the second set of plurality of illumination sources to the first set of plurality of illumination sources to compensate for at least one failed illumination source in the first set of the plurality of illumination sources.

8. An illumination system, comprising:
at least one processor;
a controller configured to work with the at least one processor, wherein the controller includes:
a first logic configured to monitor optical output power of a plurality of illumination sources over a period of time, wherein the first logic comprises a second logic configured to calibrating a subset of the plurality of illumination sources sequentially to determine optical output of the subset of the plurality of illumination sources being calibrated;
a third logic configured to control the plurality of illumination sources to maintain a predetermined level of optical output power;
a fourth logic configured to detect at least one defective illumination source in the plurality of illumination sources; and
a fifth logic configured to control at least one non-defective illumination source in the plurality of illumination sources to replace illumination of the at least one defective illumination source.

9. The system of claim 8, wherein the plurality of illumination sources comprises at least one of:
actinic illumination sources and non-actinic illumination sources; and
a first set of illumination sources having a first exposure wavelength and a second set of illumination sources having a second exposure wavelength.

10. The system of claim 8, wherein the third logic configured to control the plurality of illumination sources comprises:
a sixth logic configured to compensate for degradations of one or more of the plurality of illumination sources to maintain the predetermined level of optical output power.

11. The system of claim 10, wherein the sixth logic configured to compensate for degradations of one or more of the plurality of illumination sources comprises at least one of:
a seventh logic configured to increase current applied to the plurality of illumination sources to increase optical output power; and
an eighth logic configured to increase number of active illumination sources to increase optical output power.

12. The system of claim 8, further comprising at least one of:
a ninth logic configured to predict a lifetime of the illumination system based on parameters of the plurality of illumination sources; and
a tenth logic configured to perform periodic maintenance of the plurality of illumination sources according to a quality control schedule.

13. A computer program product comprising a non-transitory medium storing computer programs for execution by one or more computer systems, the computer program product comprising:
a first code configured to monitor optical output power of a plurality of illumination sources over a period of time, wherein the first code comprises a second code configured to calibrate a subset of the plurality of illumination sources sequentially to determine optical output of the subset of the plurality of illumination sources being calibrated; and
a third code configured to control the plurality of illumination sources to maintain a predetermined level of optical output power, wherein the third code configured to control the plurality of illumination sources comprises:
a fourth code configured to maintain a first set of the plurality of illumination sources in an active state;
fifth code configured to maintain a second set of the plurality of illumination sources in an inactive state; and
a sixth code configured to convert at least one illumination source in the second set of plurality of illumination sources to the first set of plurality of illumination sources to compensate for at least one failed illumination source in the first set of the plurality of illumination sources.

14. A computer program product comprising a non-transitory medium storing computer programs for execution by one or more computer systems, the computer program product comprising:

a first code configured to monitor optical output power of a plurality of illumination sources over a period of time, wherein the first code comprises a second code configured to calibrate a subset of the plurality of illumination sources sequentially to determine optical output of the subset of the plurality of illumination sources being calibrated; and a third code configured to control the plurality of illumination sources to maintain a predetermined level of optical output power;

a fourth code configured to detect at least one defective illumination source in the plurality of illumination sources; and a fifth code configured to control at least one non-defective illumination source in the plurality of illumination sources to replace illumination of the at least one defective illumination source.

15. The computer program product of claim 14, wherein the plurality of illumination sources comprises at least one of:

actinic illumination sources and non-actinic illumination sources; and a first set of illumination sources having a first exposure wavelength and a second set of illumination sources having a second exposure wavelength.

16. The computer program product of claim 14, wherein the third code configured to control the plurality of illumination sources comprises:

a sixth code configured to compensate for degradations of one or more of the plurality of illumination sources to maintain the predetermined level of optical output power.

17. The computer program product of claim 16, wherein the sixth code configured to compensate for degradations of one or more of the plurality of illumination sources comprises at least one of:

a seventh code configured to increase current applied to the plurality of illumination sources to increase optical output power; and an eighth code configured to increase number of active illumination sources to increase optical output power.

* * * * *